US009653615B2

(12) United States Patent
Lin et al.

(10) Patent No.: US 9,653,615 B2
(45) Date of Patent: May 16, 2017

(54) HYBRID ETSOI STRUCTURE TO MINIMIZE NOISE COUPLING FROM TSV

(71) Applicant: International Business Machines Corporation, Armonk, NY (US)

(72) Inventors: Chung-Hsun Lin, White Plains, NY (US); Yu-Shiang Lin, Elmsford, NY (US); Shih-Hsien Lo, Mount Kisco, NY (US); Joel A. Silberman, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 13/800,124

(22) Filed: Mar. 13, 2013

(65) Prior Publication Data

US 2014/0264593 A1    Sep. 18, 2014

(51) Int. Cl.
| | |
|---|---|
| *H01L 27/12* | (2006.01) |
| *H01L 29/786* | (2006.01) |
| *H01L 29/66* | (2006.01) |
| *H01L 29/06* | (2006.01) |
| *H01L 23/48* | (2006.01) |
| *H01L 21/84* | (2006.01) |

(52) U.S. Cl.
CPC ........ *H01L 29/78696* (2013.01); *H01L 21/84* (2013.01); *H01L 23/481* (2013.01); *H01L 27/1203* (2013.01); *H01L 27/1211* (2013.01); *H01L 29/0665* (2013.01); *H01L 29/66742* (2013.01); *H01L 29/66772* (2013.01); *H01L 29/78651* (2013.01); H01L 2924/0002 (2013.01)

(58) Field of Classification Search
None
See application file for complete search history.

(56) References Cited

U.S. PATENT DOCUMENTS

| | | | |
|---|---|---|---|
| 7,960,282 B2 | 6/2011 | Yelehanka et al. | |
| 2008/0258207 A1 | 10/2008 | Radosavljevic et al. | |
| 2008/0290524 A1* | 11/2008 | Lanzerotti et al. | 257/770 |
| 2010/0270597 A1 | 10/2010 | Sproch et al. | |
| 2011/0042744 A1* | 2/2011 | Cheng et al. | 257/347 |
| 2011/0049577 A1 | 3/2011 | Or-Bach et al. | |
| 2011/0095393 A1 | 4/2011 | Berliner et al. | |

(Continued)

OTHER PUBLICATIONS

J. Kim et al., "TSV Modeling and Noise Coupling in 3D IC," 2010 3rd Electronic System-Integration Technology Conference (ESTC), Sep. 13-16, 2010.

(Continued)

*Primary Examiner* — Benjamin Sandvik
(74) *Attorney, Agent, or Firm* — Vazken Alexanian; Michael J. Chang, LLC

(57) ABSTRACT

In one aspect, a method for forming an electronic device includes the following steps. An ETSOI layer of an ETSOI wafer is patterned into one or more ETSOI segments each of the ETSOI segments having a width of from about 3 nm to about 20 nm. A gate electrode is formed over a portion of the one or more ETSOI segments which serves as a channel region of a transistor, wherein portions of the one or more ETSOI segments extending out from under the gate electrode serve as source and drain regions of the transistor. At least one TSV is formed in the ETSOI wafer adjacent to the transistor. An electronic device is also provided.

11 Claims, 7 Drawing Sheets

(56) References Cited

U.S. PATENT DOCUMENTS

| | | | |
|---|---|---|---|
| 2011/0108948 A1 | 5/2011 | Kim et al. | |
| 2011/0133161 A1 | 6/2011 | Bangsaruntip et al. | |
| 2011/0241185 A1* | 10/2011 | Koester | H01L 21/568 |
| | | | 257/659 |
| 2011/0298058 A1* | 12/2011 | Kawasaki et al. | 257/401 |
| 2011/0298551 A1 | 12/2011 | Yen et al. | |
| 2011/0315950 A1 | 12/2011 | Sleight et al. | |
| 2012/0061794 A1 | 3/2012 | Sadaka | |
| 2012/0074515 A1* | 3/2012 | Chen | H01L 23/585 |
| | | | 257/491 |
| 2012/0326328 A1* | 12/2012 | Li et al. | 257/774 |
| 2014/0264605 A1* | 9/2014 | Lin | H01L 29/0665 |
| | | | 257/348 |

OTHER PUBLICATIONS

X. Sun et al., "Electrical modeling, simulation and SPICE model extraction of TSVs in Silicon Interposer," 2011 IEEE 13th Electronics Packaging Technology Conference (EPTC), Dec. 7-9, 2011, pp. 171-174.

J. Cho et al., "Guard Ring Effect for Through Silicon Via (TSV) Noise Coupling Reduction," 2010 IEEE CPMT Symposium Japan, Aug. 24-26, 2010.

C. Xu et al., "Compact Capacitance and Capacitive Coupling-Noise Modeling of Through-Oxide Vias in FDSOI Based Ultra-High Density 3-D ICs," 2011 IEEE International Electron Devices Meeting (IEDM), Dec. 5-7, 2011, pp. 34.8.1-34.8.4.

D. Perry et al., "An efficient array structure to characterize the impact of through silicon vias on FET devices," 2011 IEEE International Conference on Microelectronic Test Structures (ICMTS), Apr. 4-7, 2011, pp. 118-122.

* cited by examiner

HYBRID ETSOI STRUCTURE TO MINIMIZE NOISE COUPLING FROM TSV

FIELD OF THE INVENTION

The present invention relates to extremely thin silicon-on-insulator (ETSOI) devices and more particularly, to techniques for reducing noise coupling from through silicon vias in ETSOI devices without an area penalty.

BACKGROUND OF THE INVENTION

Through silicon vias (TSVs) are used to carry high frequency signals in three-dimensional integrated circuit (IC) technology. As opposed to back end of line (BEOL) wires, the TSV signal is very close to the silicon substrate and is expected to induce significant noise coupling into the circuits. Extremely thin silicon-on-insulator (ETSOI) devices show an even greater impact from TSV high frequency noise due to the ETSOI devices having a fully depleted channel.

Several solutions have been proposed to mitigate the noise coupling. One solution includes using large keep out zones (KOZs). However coupling is seen even when the keep out zone is large (e.g., an 80 micrometer (µm) or greater keep out zone) and there is a layout area penalty.

Another solution that has been proposed to mitigate the noise coupling is to use a thicker dielectric surrounding the TSVs. However, it is difficult in practice to form a thick dielectric layer. Thus, process flows involving a thicker dielectric result in integration challenges and decrease production yield.

Therefore, techniques for reducing the noise coupling from TSVs in ETSOI device designs without area penalty would be desirable.

SUMMARY OF THE INVENTION

The present invention provides techniques for reducing noise coupling from through silicon vias in extremely thin silicon-on-insulator (ETSOI) devices without an area penalty. In one aspect of the invention, a method for forming an electronic device is provided. The method includes the following steps. An ETSOI layer of an ETSOI wafer into one or more ETSOI segments each of the ETSOI segments having a width of from about 3 nm to about 20 nm. A gate electrode is formed over a portion of the one or more ETSOI segments which serves as a channel region of a transistor, wherein portions of the one or more ETSOI segments extending out from under the gate electrode serve as source and drain regions of the transistor. At least one through silicon via (TSV) is formed in the ETSOI wafer adjacent to the transistor.

In another aspect of the invention, an electronic device is provided. The electronic device includes a transistor formed on an ETSOI wafer having i) one or more ETSOI segments each of the ETSOI segments having a width of from about 3 nm to about 20 nm and ii) a gate electrode over a portion of the one or more ETSOI segments which serves as a channel region of the transistor, wherein portions of the one or more ETSOI segments extending out from under the gate electrode serve as source and drain regions of the transistor; and at least one TSV formed in the ETSOI wafer adjacent to the transistor.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for reducing noise coupling from through silicon vias (TSVs) in extremely thin silicon-on-insulator (ETSOI) devices without area penalty.

As will be described in detail below, the present techniques employ extremely narrow and/or segmented ETSOI around the TSV area. The extremely narrow ETSOI has a very weak body effect that can reduce the noise coupling from the TSV by way of the substrate. See above. Further, in areas of the wafer away from the TSV, a regular ETSOI configuration can be employed. Thus what is proposed herein is a hybrid sort of device architecture where the ETSOI is selectively tailored in areas near the TSV to reduce the noise coupling from the TSV. Advantageously, this is accomplished by way of the present techniques without employing a large keep out zone, thus avoiding the large area penalties associated with conventional ETSOI/TSV devices.

Figure 1:
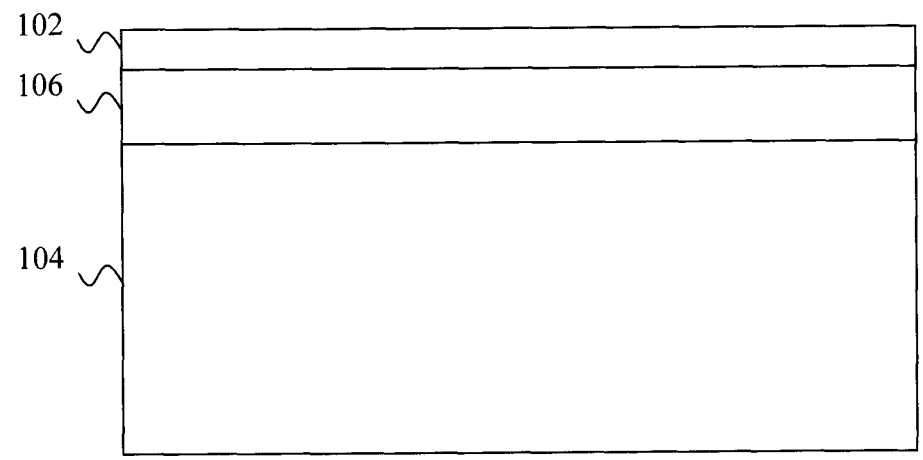
FIG. 1 is a diagram illustrating a starting structure for an extremely thin silicon-on-insulator (ETSOI) device fabrication process, i.e., a wafer having an ETSOI layer separated from a substrate by a buried oxide (BOX) according to an embodiment of the present invention.

FIGS. 1-8 are diagrams illustrating an exemplary method for fabricating an electronic ETSOI device according to the present techniques. As shown in FIG. 1, the starting platform for the process is an ETSOI wafer. The ETSOI wafer includes an ETSOI layer 102 separated from a substrate 104 by a buried oxide or BOX 106. By way of example only, the ETSOI layer 102 and the substrate are formed from a semiconductor material, such as silicon (Si) and the BOX 106 is formed from silicon oxide.

In one exemplary embodiment, the ETSOI layer 102 has a thickness of from about 3 nanometers (nm) to about 80 nm and ranges therebetween, e.g., from about 3 nm to about 20 nm and ranges therebetween. Preparing the ETSOI wafer can be accomplished in a number of different ways. For example, a thinning process can be employed to thin the SOI layer of a commercially available wafer to a desired thickness. For instance, a suitable thinning process can include oxidizing the SOI layer followed by stripping the oxide from the wafer. This process can be repeated until the desired layer thickness is achieved.

Alternatively, the process can begin with a bulk (e.g., Si) wafer. An oxygen implant can be performed into the bulk substrate to create the BOX 106. The energy of the implant can be tailored to result in a desired depth of the BOX 106 and thus a desired thickness of the ETSOI layer 102.

The characteristics of ETSOI devices, such as threshold voltage, are dependent on the thickness of the ETSOI layer. Thus, variations in the thickness of the starting ETSOI layer are preferably kept to a minimum. Accordingly, techniques such as those described for example in U.S. Patent Application Publication Number 2011/0095393 filed by Berliner et al., entitled "Creating Extremely Thin Semiconductor-on-Insulator (ETSOI) Having Substantially Uniform Thickness," the contents of which are incorporated by reference herein, may be employed to minimize thickness variations in the starting wafer.

As will be described in detail below, the ETSOI layer will be used to form one or more ETSOI transistors of the device. Each transistor will include a source region, a drain region, a channel region interconnecting the source and drain regions, and a gate electrode that regulates flow through the channel region. Due to the thinness of the ETSOI layer, the channel region is fully depleted (i.e., the depletion region covers the entire layer). A threshold voltage of each of the ETSOI transistors is set by the gate work function, rather than by channel doping as in conventional devices. The threshold voltage is not affected by channel region properties.

As highlighted above, in the area of the TSV(s) of the device (see below), the ETSOI is configured to be extremely narrow and/or segmented in order to reduce noise coupling from the TSV. This aspect will now be described in detail. For ease and clarity of depiction, the following description and associated figures will illustrate the fabrication of one ETSOI transistor and one TSV. It is to be understood however that an additional one or more of these structures could, if so desired, be fabricated in the same manner as described and depicted.

Figure 2:
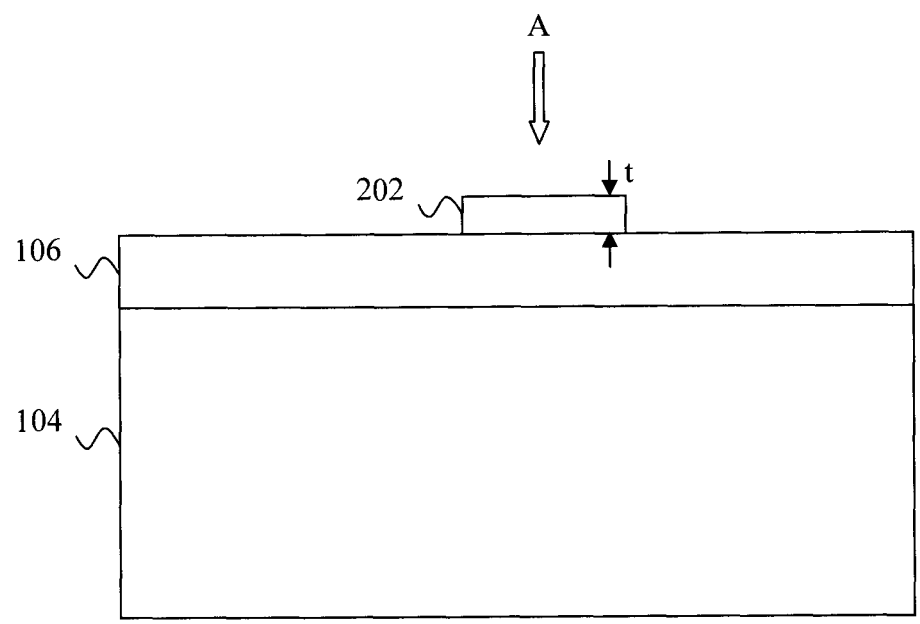
FIG. 2 is a cross-sectional diagram illustrating the ETSOI layer having been patterned into one or more extremely narrow sections according to an embodiment of the present invention.

As shown in FIG. 2, a cross-sectional cut through the wafer, the ETSOI layer is patterned into one or more extremely narrow sections 202. As will be described in detail below, when multiple (extremely narrow) ETSOI segments are employed this is referred to herein as segmented ETSOI since, rather than a larger portion of the ETSOI, multiple smaller (extremely narrow) sections/segments of the ETSOI are used instead. Using segments, rather than one larger portion has been found to significantly reduce the noise coupling from the TSV(s). See below. Each of the extremely narrow sections 202 will have a thickness t (see FIG. 2) that is based on the thickness of the ETSOI layer 102. As provided above, the ETSOI layer in one exemplary embodiment has a thickness of from about 3 nm to about 80 nm and ranges therebetween, e.g., from about 3 nm to about 20 nm and ranges therebetween. Accordingly, in that case the extremely narrow sections 202 will also each have a thickness of from about 3 nm to about 80 nm and ranges therebetween, e.g., from about 3 nm to about 20 nm and ranges therebetween. As will be described in detail below, the extremely narrow section(s) 202 each have a width w of from about 3 nm to about 20 nm and ranges therebetween. Segments of the ETSOI layer with such a width are considered herein to be "extremely narrow."

The ETSOI layer 102 can be patterned into the extremely narrow segment or segments using conventional lithography techniques. By way of example only, a lithography hardmask can be formed on the wafer with the footprint and location of the one or more extremely narrow ETSOI segments. The ETSOI layer 102 can then be patterned through the mask using, e.g., a reactive ion etching (RIE) process, stopping on the BOX. The hardmask can then be removed.

As provided above, the patterning of the ETSOI into extremely narrow segment(s) is done in the area of the TSV—so as to reduce noise coupling from the TSV through the substrate. As will be described in detail below, the "area of the TSV" refers to any portion of the wafer that is a distance of less than or equal to about 80 micrometers (µm) and ranges therebetween from the TSV, e.g., a distance of less than or equal to about 50 µm and ranges therebetween from the TSV. With conventional techniques, this area around the TSV would constitute a keep out zone (KOZ) and thus a large area penalty would result. Thus, being able to place (locate) device elements (such as the ETSOI transistor) within this area (by way of the present techniques) provides a significant advantage in terms of space savings and scaling properties of the design.

Figure 3A:
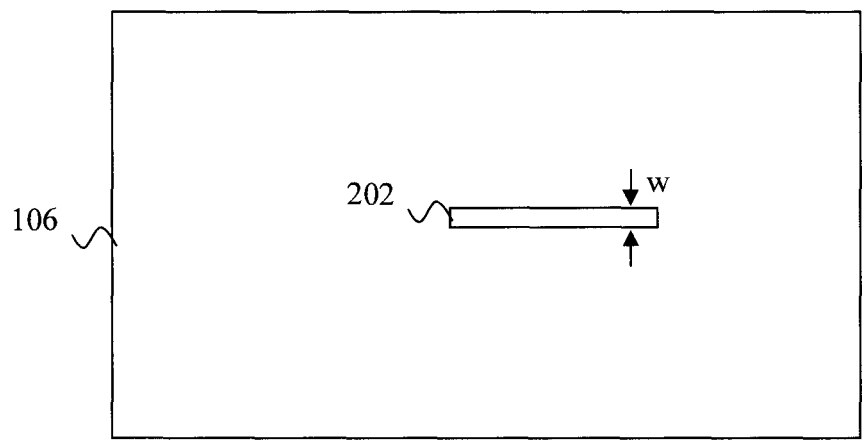
FIG. 3A is a top-down diagram illustrating one exemplary configuration of the patterned ETSOI wherein the ETSOI is patterned into a single extremely narrow segment according to an embodiment of the present invention.
Figure 3B:
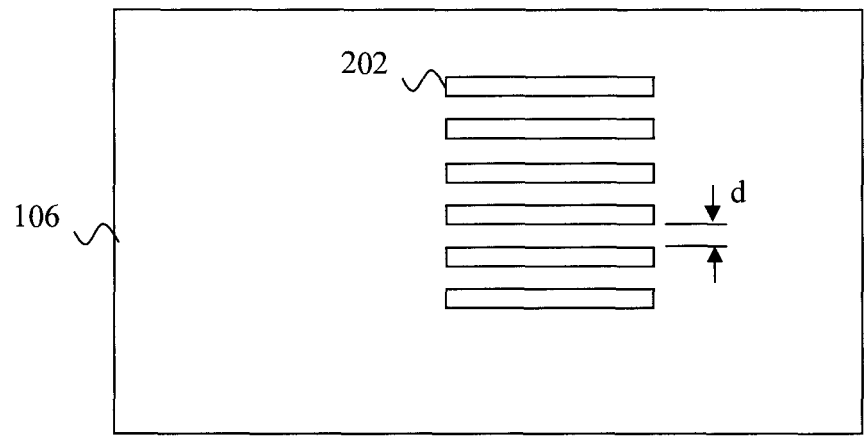
FIG. 3B is a top-down diagram illustrating another exemplary configuration of the patterned ETSOI wherein the ETSOI is patterned into a multiple extremely narrow segments according to an embodiment of the present invention.

The patterning of the ETSOI layer into one or more extremely narrow segments is shown further illustrated in FIGS. 3A and 3B. FIG. 3A provides one exemplary configuration of the patterned ETSOI. Specifically, FIG. 3A illustrates the patterning of the ETSOI into a single extremely narrow segment 202. What is shown in FIG. 3A is a top-down view of the structure of FIG. 2, e.g., from viewpoint A (see FIG. 2).

The segment of ETSOI shown in FIG. 3A is extremely narrow. As provided above, the term "extremely narrow" as used herein can refer to a segment of the ETSOI having a width w (see FIG. 3A) of from about 3 nm to about 20 nm and ranges therebetween. Alternatively, a larger ETSOI area may be needed for forming the transistor. In that case, multiple ETSOI segments may be employed. See FIG. 3B.

The determination as to whether one segment or multiple segments are needed can depend on the original circuit needs. For instance, some circuits need large effective width and thus multiple segments may be employed, whereas other circuits only need a small effective width and thus one to a few segments may be employed. As provided above, using multiple extremely narrow ETSOI segments rather than one larger ETSOI region significantly reduces noise coupling from the TSV by way of the substrate.

FIG. 3B provides another exemplary configuration of the patterned ETSOI. Specifically, FIG. 3B illustrates the patterning of the ETSOI into multiple extremely narrow segments 202. What is shown in FIG. 3B is a top-down view of the structure of FIG. 2, e.g., from viewpoint A (see FIG. 2). Each of the extremely narrow segments 202 preferably each has a width w of from about 3 nm to about 20 nm and ranges therebetween—as provided above. Further, as shown in FIG. 3B, when multiple (extremely narrow) segments are employed, it is preferable that the segments are spaced apart from one another (i.e., each segment is separated from adjacent segments) by a distance d of from about 3 nm to about 40 nm and ranges therebetween. It is notable that FIGS. 3A and 3B are being shown as separated embodiments merely to illustrate the different possible options according to the present techniques for reducing noise coupling. If so desired, the techniques shown in FIGS. 3A and 3B can be implemented together in the same device.

Figure 4:
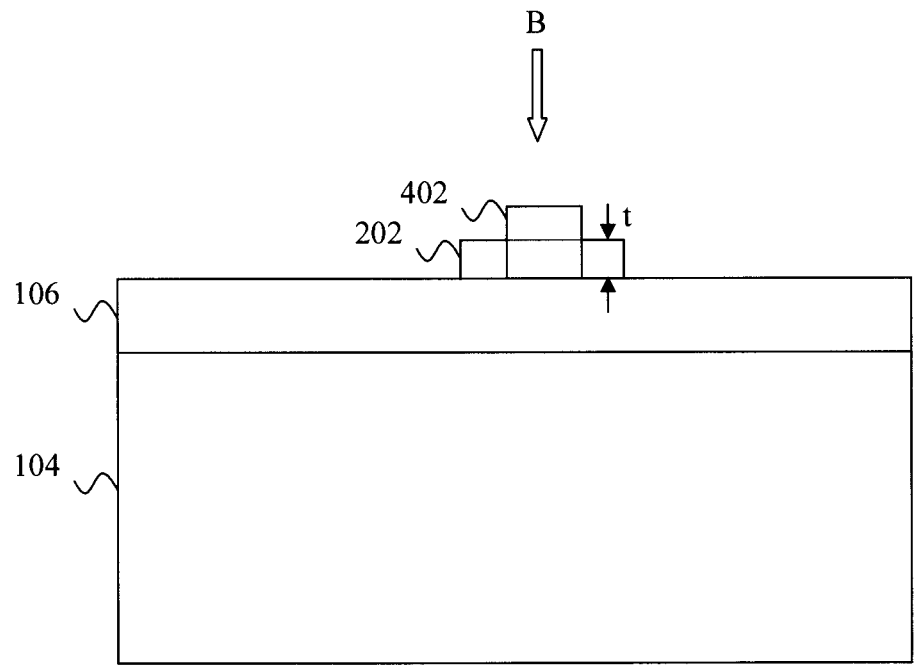
FIG. 4 is a cross-sectional diagram illustrating a gate electrode having been formed over the one or more extremely narrow ETSOI segments according to an embodiment of the present invention.

Switching back again to a cross-sectional view, FIG. 4 shows a gate electrode 402 having been formed over the one or more extremely narrow ETSOI segments 202. By way of example only, gate electrode 402 can be formed by depositing a suitable gate material or materials and then patterning the material using conventional lithography techniques into the gate electrode 402. Suitable gate materials include, but are not limited to, doped polysilicon and/or a metal or combination of metals. The portion(s) of the extremely narrow ETSOI segment(s) covered by the gate electrode will serve as a channel region of the transistor and portions of the extremely narrow ETSOI segment(s) extending out from under the gate electrode will serve as source and drain regions of the device. A silicide process may be employed to form contacts to the source and drain regions.

Figure 5A:
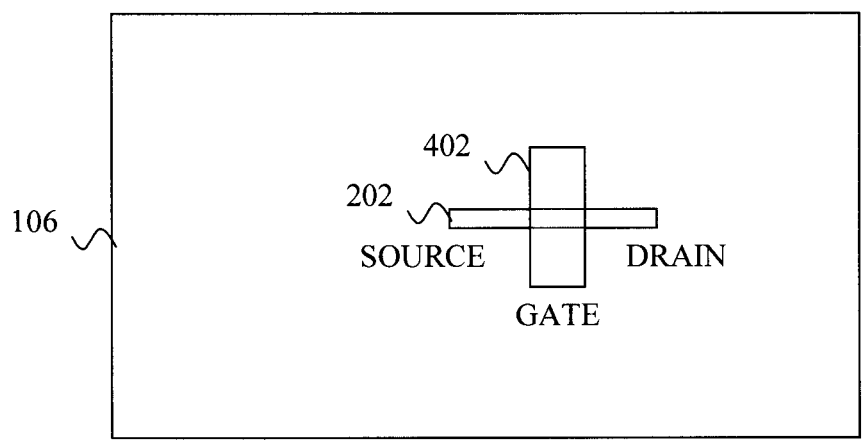
FIG. 5A is a top-down diagram illustrating the formation of the gate electrode in the exemplary scenario wherein the ETSOI has been patterned into a single extremely narrow segment according to an embodiment of the present invention.
Figure 5B:
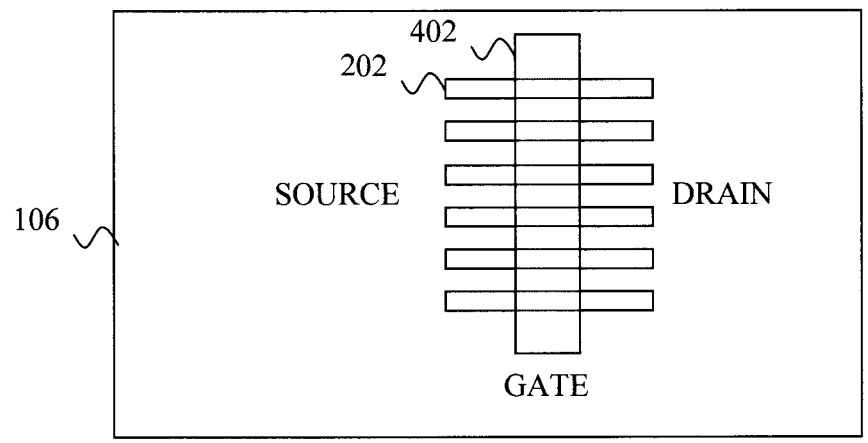
FIG. 5B is a top-down diagram illustrating the formation of the gate electrode in the exemplary scenario wherein the ETSOI has been patterned into multiple extremely narrow segments according to an embodiment of the present invention.

The formation of the gate electrode 402 is shown further illustrated in FIGS. 5A and 5B. FIG. 5A illustrates the exemplary scenario described above wherein the ETSOI has been patterned into a single extremely narrow segment 202. What is shown in FIG. 5A is a top-down view of the structure of FIG. 4, e.g., from viewpoint B (see FIG. 4). As described above, a silicide process may also be employed to form source and drain contacts to the portions of the extremely narrow ETSOI segment(s) extending out from under the gate electrode 402. See FIG. 5A.

FIG. 5B illustrates the exemplary scenario described above wherein the ETSOI has been patterned into multiple extremely narrow segments 202. What is shown in FIG. 5B is a top-down view of the structure of FIG. 4, e.g., from viewpoint B (see FIG. 4). As described above, a silicide process may also be employed to form source and drain contacts to the portions of the extremely narrow ETSOI segment(s) extending out from under the gate electrode 402. See FIG. 5B.

It is notable that FIGS. 5A and 5B are being shown as separated embodiments merely to illustrate the different possible options according to the present techniques for reducing noise coupling. If so desired, the techniques shown in FIGS. 5A and 5B can be implemented together in the same device.

Figure 6:
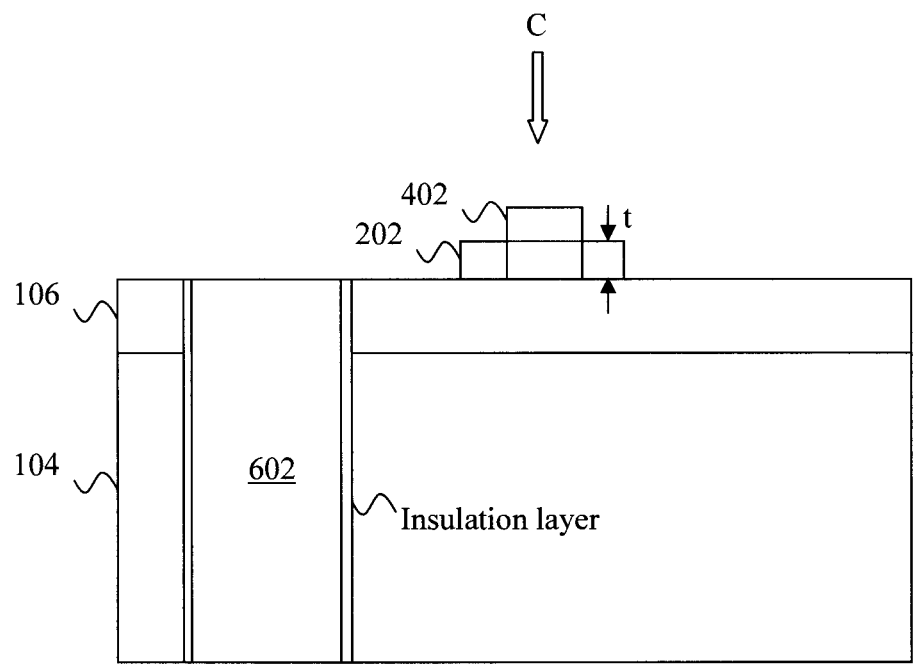
FIG. 6 is a cross-sectional diagram illustrating one or more through silicon vias (TSVs) having been formed in the wafer according to an embodiment of the present invention.

Switching back again to a cross-sectional view, as shown in FIG. 6 next one or more TSVs 602 are formed in the wafer adjacent to the ETSOI transistors. It is notable that the process flow being presented herein is merely exemplary, and depending on the particular application at hand, the steps could be performed in a different order than that being presented herein. For instance, it might be desirable to form the TSV(s) prior to fabricating the ETSOI transistors. Alternatively, one or more of the steps for fabricating the TSV(s) and the ETSOI transistors may be performed concurrently.

TSVs such as TSV 602 can serve as power and ground interconnections and/or as signal interconnections. According to an exemplary embodiment, each TSV 602 is formed by first etching a hole in the wafer corresponding to the TSV. For example, the hole may be etched in the wafer using a deep Si RIE. An insulation layer may then be deposited into and lining the hole (and potentially over the surface of the wafer). Suitable materials for forming the insulating layer include, but are not limited to, an oxide or a nitride material. The hole is then filled with a metal(s) to form the TSV. According to an exemplary embodiment, a combined seed/barrier layer, such as a tantalum (Ta)/tantalum nitride (TaN) or titanium (Ti)/titanium nitride (TiN), is first deposited over the insulating layer. A conductor such as chemical vapor deposition (CVD) deposited tungsten (W) or plated copper (Cu), is then used to fill the hole to form the TSV. In FIG. 6, TSV 602 is represented schematically as a single metal via with the understanding that the via itself might actually be made up of multiple layers—as described immediately above.

Figure 7A:
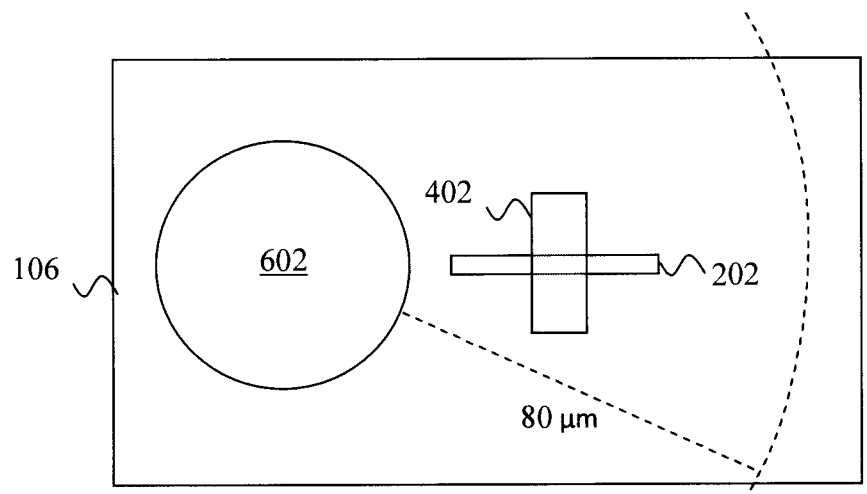
FIG. 7A is a top-down diagram illustrating the formation of the TSV(s) in the exemplary scenario wherein the ETSOI has been patterned into a single extremely narrow segment according to an embodiment of the present invention.
Figure 7B:
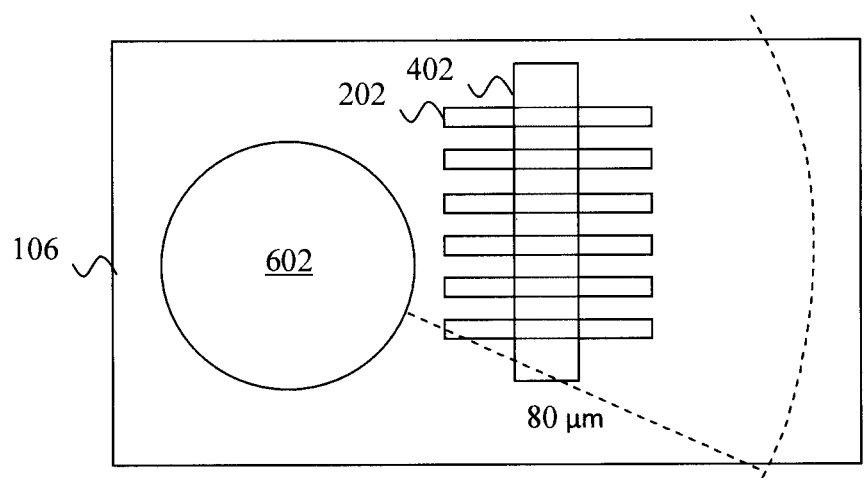
FIG. 7B is a top-down diagram illustrating the formation of the TSV(s) in the exemplary scenario wherein the ETSOI has been patterned into multiple extremely narrow segments according to an embodiment of the present invention.

The formation of the TSV(s) 602 is shown further illustrated in FIGS. 7A and 7B. FIG. 7A illustrates the exemplary scenario described above wherein the ETSOI has been patterned into a single extremely narrow segment 202. What is shown in FIG. 7A is a top-down view of the structure of FIG. 6, e.g., from viewpoint C (see FIG. 6). As described above, the present process for employing one or more extremely narrow ETSOI segments is implemented in the area of the TSV, which is defined herein as referring to any portion of the wafer that is less than or equal to 80 µm and ranges therebetween from the TSV, e.g., a distance of less than or equal to about 50 µm and ranges therebetween from the TSV. See FIG. 7A. Thus, a distance between the TSV(s) and the transistor(s) on the ETSOI wafer is less than or equal to about 80 µm and ranges therebetween, e.g., less than or equal to about 50 µm and ranges therebetween. With conventional ETSOI fabrication techniques, this area would be considered within a keep out zone and no devices could be built there.

FIG. 7B illustrates the exemplary scenario described above wherein the ETSOI has been patterned into multiple extremely narrow segments 202. What is shown in FIG. 7B is a top-down view of the structure of FIG. 6, e.g., from viewpoint C (see FIG. 6). As described above, the present process for employing one or more extremely narrow ETSOI segments is implemented in the area of the TSV, which is defined herein as referring to any portion of the wafer that is less than or equal to about 80 µm and ranges therebetween from the TSV, e.g., a distance of less than or equal to about 50 µm and ranges therebetween from the TSV. See FIG. 7B. Thus, a distance between the TSV(s) and the transistor(s) on the ETSOI wafer is less than or equal to about 80 µm and ranges therebetween, e.g., less than or equal to about 50 µm and ranges therebetween It is notable that FIGS. 7A and 7B are being shown as separated embodiments merely to illustrate the different possible options according to the present techniques for reducing noise coupling. If so desired, the techniques shown in FIGS. 7A and 7B can be implemented together in the same device.

As provided above, according to one exemplary implementation of the present approach a hybrid device architecture is proposed where the ETSOI is selectively tailored in areas near the TSV to reduce the noise coupling form the TSV. For devices not within the area of a TSV, the extremely narrow ETSOI approach does not need to be implemented. While it is certainly possible to implement the above-described specially configured ETSOI throughout all of the devices, a reduction in production complexity and an increase in throughput may be achieved through use of the hybrid structure.

Figure 8A:
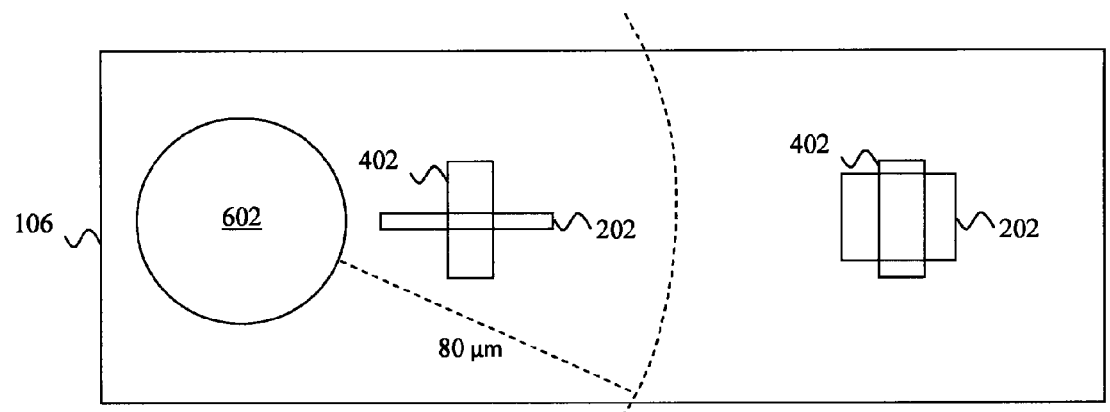
FIG. 8A is a top-down diagram illustrating a hybrid ETSOI device structure in the exemplary scenario wherein the ETSOI in the area of the TSV has been patterned into a single extremely narrow segment according to an embodiment of the present invention.
Figure 8B:
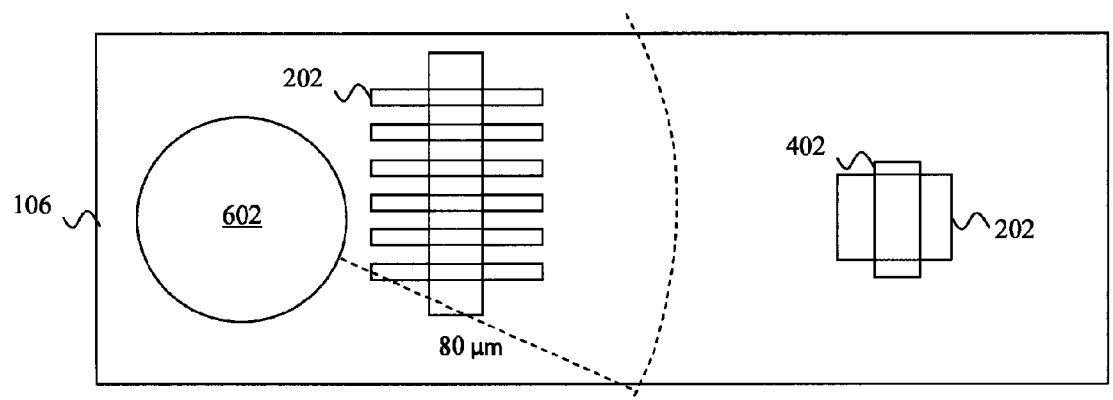
FIG. 8B is a top-down diagram illustrating a hybrid ETSOI device structure in the exemplary scenario wherein the ETSOI in the area of the TSV has been patterned into multiple extremely narrow segments according to an embodiment of the present invention.

Hybrid ETSOI device structures are shown in FIGS. 8A and 8B. For consistency, the same numbering is employed as above, where like numbering is used to denote the same structures. FIG. 8A illustrates the exemplary scenario described above wherein the ETSOI has been patterned into a single extremely narrow segment 202. As shown in FIG. 8A, for those devices being formed "outside" the area of the TSV 602 (in this depiction the device on the right), a standard patterning of the ETSOI is implemented rather than the extremely narrow ETSOI segment. Compare this with the device on the left which is formed according to the above-described process.

FIG. 8B illustrates the exemplary scenario described above wherein the ETSOI has been patterned into a multiple extremely narrow segment 202. As shown in FIG. 8B, for those devices being formed "outside" the area of the TSV 602 (in this depiction the device on the right), a standard patterning of the ETSOI is implemented rather than the extremely narrow ETSOI segment. Compare this with the device on the left which is formed according to the above-described process.

Again, it is notable that FIGS. 8A and 8B are being shown as separated embodiments merely to illustrate the different possible options according to the present techniques for reducing noise coupling. If so desired, the techniques shown in FIGS. 8A and 8B can be implemented together in the same device.

Figure 9:
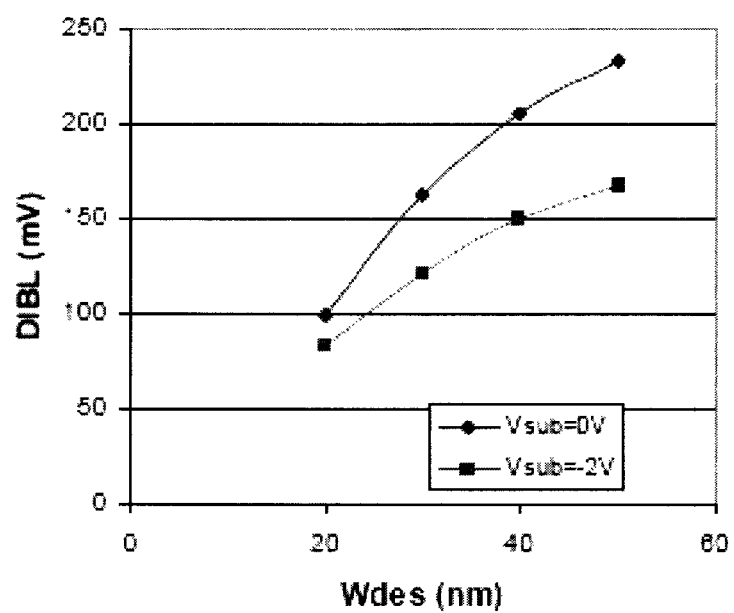
FIG. 9 is a diagram illustrating drain induced barrier lowering (DIBL) as a function of Wdes according to an embodiment of the present invention.

FIG. 9 is a diagram illustrating drain induced barrier lowering (DIBL) (measured in millivolts (mV)) as a function of Wdes (measured in nanometers (nm)) for substrate bias at 0 volts (V) and −2V. Wdes is the design width for active transistor (for planar devices). FIG. 9 illustrates that when the Wdes of the ETSOI is very narrow, it becomes almost FINFET-like in shape. So any substrate noise coupling from the TSVs is minimized. Substrate bias effect could usually be seen as a DIBL modulation by applying substrate bias. As can be seen in FIG. 9, the DIBL delta between two Vsub is minimized when there is a very small Wdes—less substrate noise coupling.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming an electronic device, comprising the steps of:
patterning an extremely thin silicon-on-insulator (ETSOI) layer of an ETSOI wafer into ETSOI segments comprising first ETSOI segments and at least one second ETSOI segment, each of the first ETSOI segments having a width of from about 3 nm to about 20 nm;
forming a gate electrode over a portion of the first ETSOI segments which serves as a channel region of a first transistor, wherein portions of the first ETSOI segments extending out from under the gate electrode serve as source and drain regions of the first transistor;
forming at least one through silicon via (TSV) in the ETSOI wafer adjacent to the first transistor,
wherein the first ETSOI segments are rectangular in shape with first sides having a first length and second sides having a second length, wherein the first length is greater than the second length, wherein the ETSOI segments are oriented with the first sides facing one another and the second sides facing the at least one TSV, and wherein a distance between the at least one TSV and the first transistor on the ETSOI wafer is less than or equal to about 80 μm; and
forming at least one second transistor on the ETSOI wafer comprising the at least one second ETSOI segment having a width that is greater than the width of the first ETSOI segments in the first transistor, wherein a distance between the at least one TSV and the second transistor on the ETSOI wafer is greater than about 80 μm, and wherein the first transistor and the second transistor comprise a hybrid device structure.

2. The method of claim 1, wherein the ETSOI layer has a thickness of from about 3 nm to about 80 nm.

3. The method of claim 1, wherein the ETSOI layer has a thickness of from about 3 nm to about 20 nm.

4. The method of claim 1, wherein the ETSOI layer is patterned using reactive ion etching.

5. The method of claim 1, wherein the ETSOI layer is patterned into multiple ETSOI segments.

6. The method of claim 5, wherein a spacing between adjacent first ETSOI segments is from about 3 nm to about 40 nm.

7. The method of claim 1, wherein the gate electrode comprises at least one metal.

8. The method of claim 1, wherein the gate electrode comprises doped polysilicon.

9. The method of claim 1, wherein the step of forming the at least one TSV in the wafer comprises the steps of:
etching a hole in the ETSOI wafer;
depositing an insulation layer into and lining the hole; and
filling the hole with at least one metal to form the at least one TSV in the ETSOI wafer.

10. The method of claim 1, wherein a distance between the at least one TSV and the first transistor on the ETSOI wafer is less than or equal to about 50 μm.

11. The method of claim 9, wherein the first transistor is formed on a buried oxide (BOX) of the ETSOI wafer over a substrate of the ETSOI wafer, wherein the at least one TSV extends through the BOX and the substrate, and wherein the insulation layer separates the at least one metal from the BOX and the substrate.

* * * * *